United States Patent
Yoo et al.

(10) Patent No.: US 10,576,841 B2
(45) Date of Patent: Mar. 3, 2020

(54) BATTERY MANAGEMENT SYSTEM AND METHOD OF VEHICLE

(71) Applicants: Hyundai Motor Company, Seoul (KR); Kia Motors Corporation, Seoul (KR)

(72) Inventors: Chang Ryeol Yoo, Incheon (KR); Ho Joong Lee, Anyang-si (KR); Yong Hyun Kim, Seoul (KR); Hong Min Oh, Yongin-si (KR); Dong Jun Shin, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 403 days.

(21) Appl. No.: 15/374,873

(22) Filed: Dec. 9, 2016

(65) Prior Publication Data
US 2018/0086215 A1    Mar. 29, 2018

(30) Foreign Application Priority Data
Sep. 26, 2016    (KR) .................. 10-2016-0122829

(51) Int. Cl.
| B60L 53/00 | (2019.01) |
| B60L 58/16 | (2019.01) |
| B60L 58/12 | (2019.01) |
| H01M 10/42 | (2006.01) |
| H01M 10/44 | (2006.01) |
| G01R 31/392 | (2019.01) |

(52) U.S. Cl.
CPC ............... *B60L 53/00* (2019.02); *B60L 58/12* (2019.02); *B60L 58/16* (2019.02); *H01M 10/4257* (2013.01); *H01M 10/44* (2013.01); *G01R 31/392* (2019.01); *Y02T 10/705* (2013.01); *Y02T 10/7005* (2013.01); *Y02T 10/7044* (2013.01)

(58) Field of Classification Search
USPC ........................................................ 320/134
See application file for complete search history.

(56) References Cited

U.S. PATENT DOCUMENTS

| 7,602,147 | B2 | 10/2009 | Katzenberger | |
| 2013/0113277 | A1* | 5/2013 | Kim | H01M 10/425 307/9.1 |
| 2015/0061550 | A1* | 3/2015 | Schulz | H02P 3/14 318/376 |
| 2015/0256004 | A1* | 9/2015 | Miller | H02J 7/0021 320/107 |

FOREIGN PATENT DOCUMENTS

| JP | H0855640 A | 2/1996 |
| JP | 2002171683 A | 6/2002 |

(Continued)

*Primary Examiner* — Robert Grant
(74) *Attorney, Agent, or Firm* — Slater Matsil, LLP

(57) ABSTRACT

A battery management method can be used for a vehicle. The method includes determining whether battery refresh proceeds and determining whether battery aging proceeds based on a time period in which the battery refresh proceeds, a battery state of charge, and a battery current during the battery refresh. Battery discharge is controlled based on determining that the battery aging proceeds. Charging is controlled according to a battery refresh map in order to restore the battery.

16 Claims, 5 Drawing Sheets

(56) References Cited

FOREIGN PATENT DOCUMENTS

| | | | |
|---|---|---|---|
| JP | 2006314192 | A | 11/2006 |
| JP | 2010074960 | A | 4/2010 |
| KR | 100507486 | B1 | 8/2005 |
| KR | 101526763 | B1 | 6/2015 |
| KR | 20150085795 | A | 7/2015 |
| KR | 1020160007870 | A | 1/2016 |

* cited by examiner

BATTERY MANAGEMENT SYSTEM AND METHOD OF VEHICLE

CROSS-REFERENCE TO RELATED APPLICATIONS

This application claims under 35 U.S.C. § 119(a) the benefit of priority to Korean Patent Application No. 10-2016-0122829 filed on Sep. 26, 2016, the entire contents of which are incorporated herein by reference.

TECHNICAL FIELD

The present disclosure relates to a method and system for managing a battery of a vehicle. More particularly, it relates to a method and system for managing a battery of a vehicle, for charge efficiency in consideration of aging characteristics of the battery.

BACKGROUND

In general, a vehicle includes a battery for supplying power to various electric loads and an alternator for supplying power generated during vehicle driving to the battery and the electric loads.

Recently, research has been actively conducted into an eco-friendly car that uses a high-voltage battery as an energy source, such as a hybrid electric vehicle (HEV) and an electric vehicle (EV) due to problems in terms of energy saving and the environment.

The above battery for a vehicle is frequently charged and discharged under various conditions such as a driving condition and an electric load operating condition and, thus, there is a problem in that a service lifetime of the battery is reduced.

Referring to FIG. 1, a battery includes a metal grid 10 for a negative electrode and a positive electrode, an active material 20 ($PbO_2$) coated on the grid 10, and so on. The grid 10 provides electric contact between a positive active material and a negative active material, allowing current to flow.

When a predetermined time period elapses after the battery is discharged, interfacial resistance between the grid 10 and the active material 20 increases and, then a heating value during charging and discharging increases, forming a grid corrosion layer including Pb-Oxide and $Pb_nO$ at an interface of the grid 10, which contacts the active material.

In particular, there is a problem in that capacity of an active material is reduced due to the grid corrosion layer and a service life of a battery is reduced.

For reference, capacity of the active material is reduced due to change in materials in a battery, that is, due to sulphation, shedding, softening, etc. as follows.

Sulphation: Irreversible lead sulfate crystallization.
Shedding: Phenomenon of shedding an active material due to mechanical stress such as over-discharge.
Softening: Phenomenon of weakening bond between particles of an active material due to reduction in electrical conductivity.

In addition, although a battery controller installed in a vehicle, that is, a battery management system (BMS) appropriately manages charging and discharging properties of a battery, there is a problem in that a battery is not sufficiently charged as a service life of a battery decreases and when a battery is left for a long time in a discharged state due to customer's mistakes, there is a problem in that an active material in a battery is immobilized, remarkably reducing a battery lifetime.

SUMMARY

The present disclosure has been made in an effort to solve the above-described problems associated with prior art.

In one aspect, the present disclosure provides a battery management system and method of a vehicle, for improving charging efficiency and durability of a battery by performing control to activate an active material in the battery when battery aging is predicted and is determined to proceed using the electrochemical properties of the battery.

In a preferred embodiment, a battery management system of a vehicle includes a battery aging determination module for determining whether a battery is in an aging state in a refresh period in which the battery is rechargeable for a long time, a battery activation module for stopping battery charging via battery refresh and controlling battery discharge when the battery aging determination module determines that battery aging proceeds, and a battery charging restoration module for performing charge control according to a refresh map for battery restoration after reversible reaction of an active material in the battery is smoothly made via discharge control of the battery activation module.

In another preferred embodiment, a battery management method of a vehicle includes determining whether battery refresh proceeds by a battery aging determination module, determining whether battery aging proceeds based on a time period in which battery refresh proceeds, battery state of charge, and battery current during battery refresh by the battery aging determination module, controlling battery discharge, upon determining that the battery aging proceeds, by a battery activation module, and controlling charging according to a battery refresh map in order to restore the battery by a battery charging restoration module.

In yet another preferred embodiment, a battery system for a vehicle includes a battery, a processor, and a non transitory computer-readable storage medium storing a program to be executed by the processor. The program includes instructions to determine whether a battery refresh proceeds, to determine whether battery aging proceeds based on a time period in which the battery refresh proceeds, a battery state of charge, and a battery current during the battery refresh, to control battery discharge of the battery based on a determination that the battery aging proceeds, and to control charging of the battery according to a battery refresh map in order to restore the battery.

Other aspects and preferred embodiments of the invention are discussed infra.

The above and other features of the invention are discussed infra.

BRIEF DESCRIPTION OF THE DRAWINGS

The above and other features of the present disclosure will now be described in detail with reference to certain exemplary embodiments thereof illustrated the accompanying drawings which are given hereinbelow by way of illustration only, and thus are not limitative of the present disclosure, and wherein.

Figure 1:
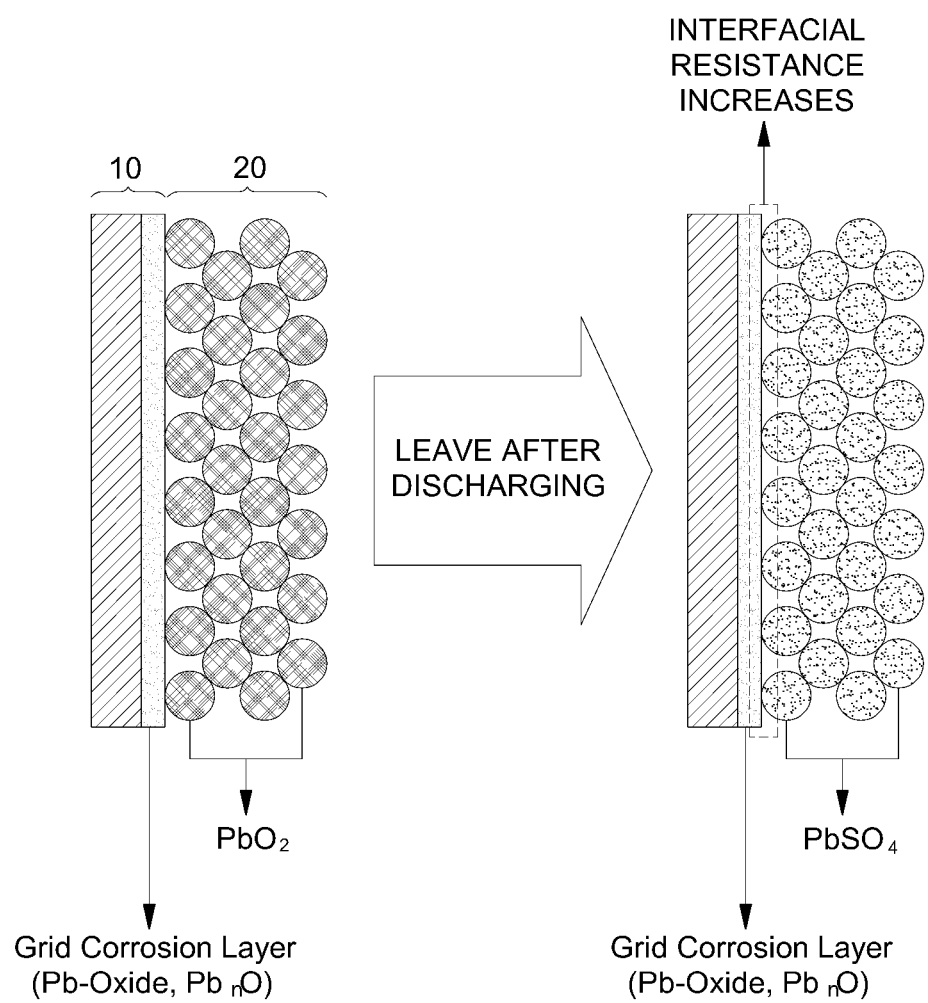
FIG. 1 is a schematic diagram illustrating battery durability.

It should be understood that the appended drawings are not necessarily to scale, presenting a somewhat simplified representation of various preferred features illustrative of the basic principles of the invention. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION OF ILLUSTRATIVE EMBODIMENTS

Hereinafter reference will be made in detail to various embodiments of the present disclosure, examples of which are illustrated in the accompanying drawings and described below.

According to the present disclosure, state of charge (SOC) charging efficiency and durability of a battery may be improved by performing control to activate an active material in the battery when battery aging is predicted and is determined to proceed in order to overcome a problem in that it is difficult to restore battery SOC via simple charging when an active material in a pole plate of a battery is hardened in a $PbSO_4$ state under a degrading condition of battery durability or a specific condition (discharged state maintaining condition, etc.).

Figure 2:
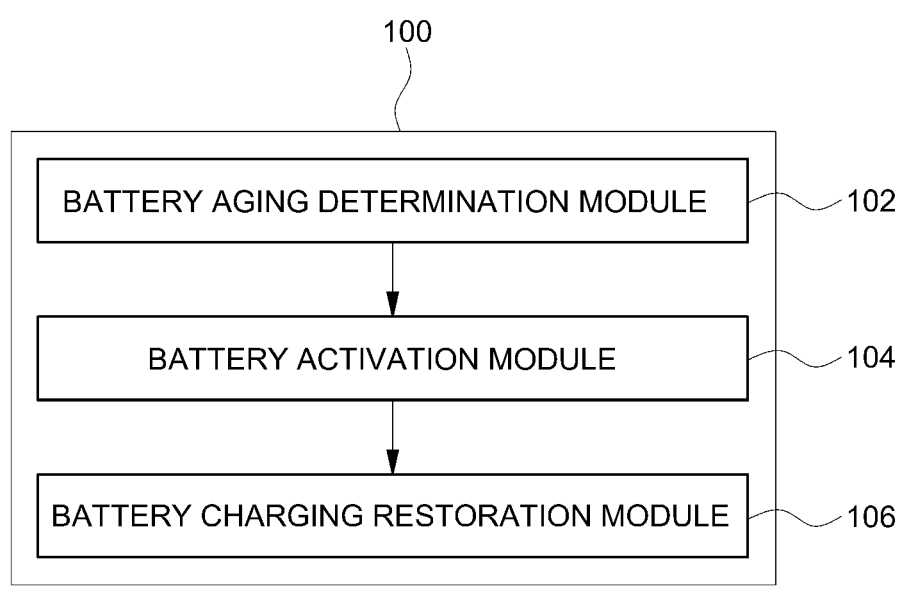
FIG. 2 is a diagram illustrating a structure of a battery management system (BMS) according to the present disclosure.

To this end, referring to FIG. 2, a battery management system (BMS) 100 according to the present disclosure may include a battery aging determination module 102, a battery activation module 104, and a battery charging restoration module 106.

That is, the BMS 100 for overall management of a battery may include the battery aging determination module 102, the battery activation module 104, and the battery charging restoration module 106.

The battery aging determination module 102 may determine whether a battery is in an aging state in a refresh period in which the battery is rechargeable for a long time.

Much disturbance occurs in a vehicle due to various environmental factors, various components, driving patterns, and so on and, due to such disturbance factors, it may be difficult to consistently recognize battery aging characteristics.

Accordingly, a pattern for constantly controlling a battery for a long time needs to be selected in order to accurately recognize the battery aging characteristics and, thus, the battery aging determination module 102 may determine battery aging in a refresh period in which a battery is rechargeable for a long time among patterns for constantly controlling the battery.

Even if a battery is charged for a predetermined time according to entrance into battery refresh, when states of a voltage, current, and SOC do not satisfy threshold levels during battery charging, the battery aging determination module 102 may determine that battery aging proceeds.

When the battery aging determination module 102 determines that battery aging proceeds, the battery activation module 104 may stop battery charging by battery refresh and control battery discharge.

In this case, battery discharge may be controlled by the battery activation module 104 according to chemical properties of the battery and, in this regard, an active material in the battery is changed to an unstable state via discharging rather than simple charging so as to smooth reversible reaction of the active material in the battery.

The battery charging restoration module 106 may restore the battery via sufficient charge control after the battery activation module 104 smooths reversible reaction of the active material in the battery via discharge control.

In this case, when the battery is not restored, an aging factor may be added and discharge control of the battery activation module 104 and charge control of the battery charging restoration module 106 may be repeatedly performed again and, thus, a battery behavior region may be appropriately changed according to durability to improve battery charging efficiency.

For example, an available SOC region, charging and discharging voltages, charging and discharging current, and so on may be adjusted to restore chemical properties of a battery, thereby improving battery charging efficiency and battery durability.

The battery management system 100 can be implemented in a number of ways. For example, known hardware can be controlled using any control circuitry, for example, a microcontroller or digital logic circuitry implemented, for example, in an application specific integrated circuit (ASIC). In the illustrated example, the modules 102, 104 and 106 of BMS 1000 can be software modules. In other words, the BMS 100 could include a processor and a non-transitory computer-readable storage medium storing a program to be executed by the processor.

Here, a battery management method according to the present disclosure will be sequentially described in more detail. This method could be implemented in software or hardware.

Figure 3:
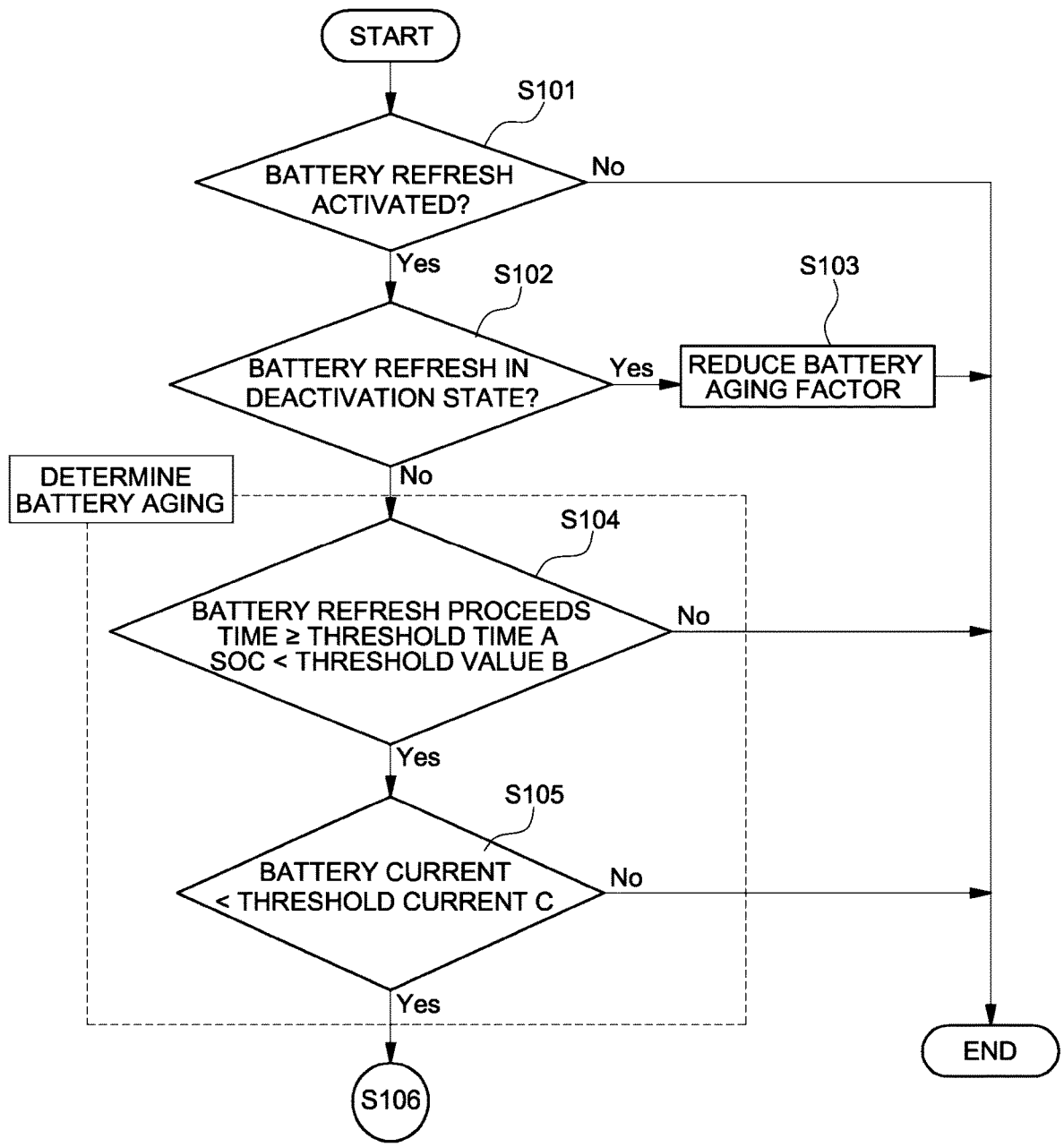
FIGS. 3 to 5 are flowcharts of a battery management method according to the present disclosure.
Figure 4:
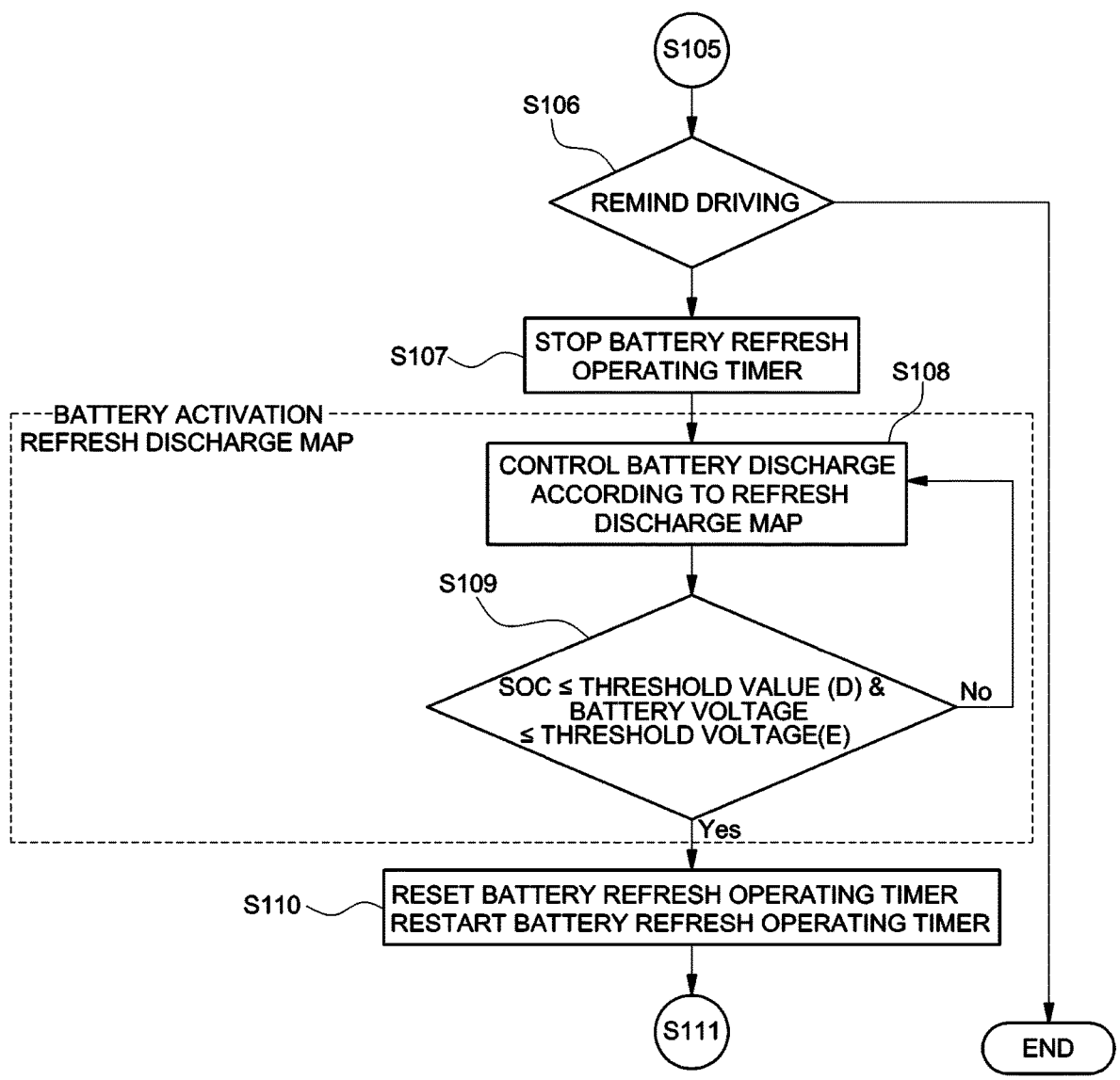
Figure 5:
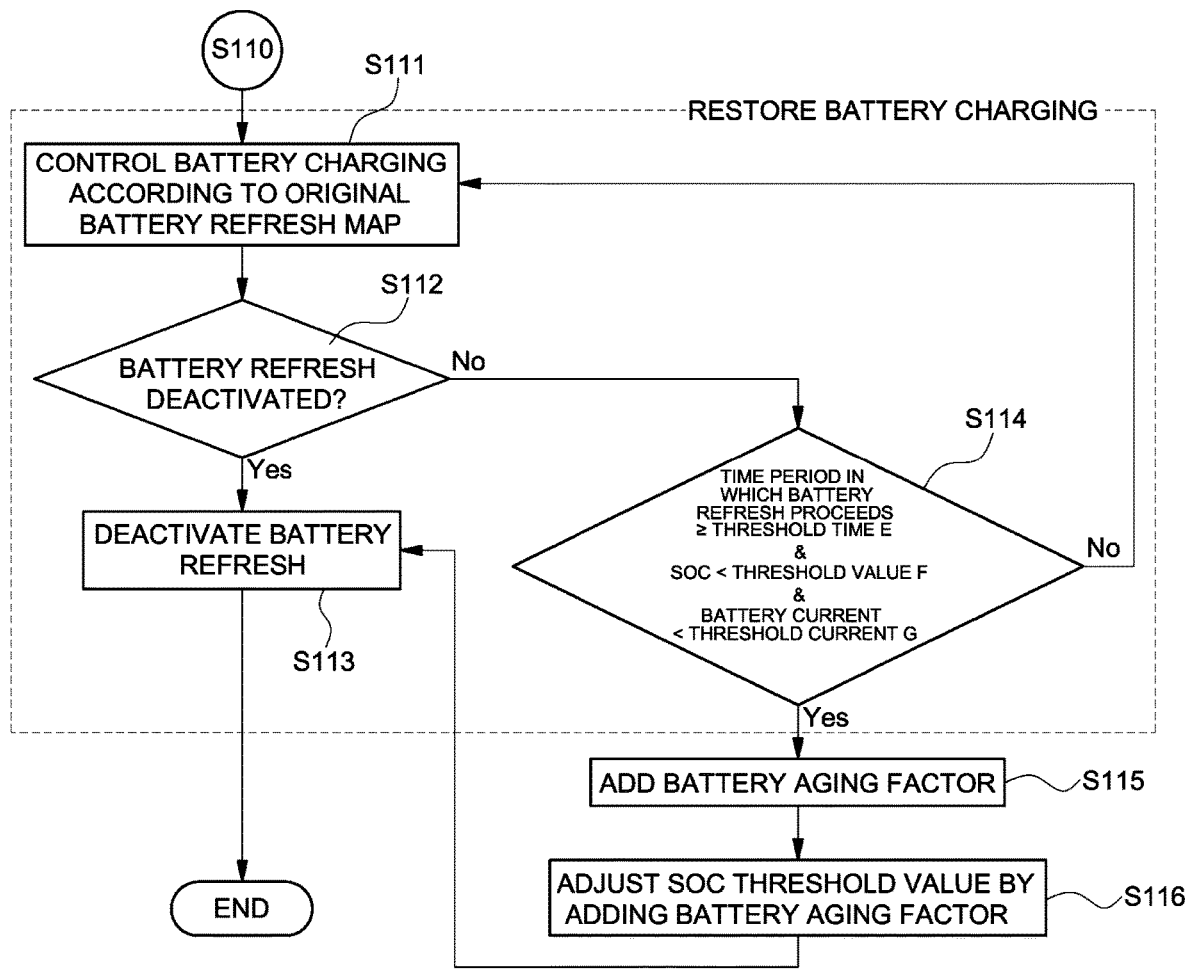

FIGS. 3 to 5 are flowcharts of a battery management method according to the present disclosure.

First, whether battery refresh proceeds may be determined (S101)

Battery refresh refers to battery recharging with battery SOC at a predetermined level or more when battery SOC is degraded to a predetermined level or less.

In this case, whether battery refresh proceeds may be determined in order to determine battery aging in a refresh period in which the battery is rechargeable for a long time.

Accordingly, even if a battery is charged for a predetermined time according to entrance into battery refresh, when states of a voltage, current, and SOC do not satisfy threshold levels during battery charging, the battery aging determination module 102 may determine that battery aging proceeds.

When battery refresh is completed, whether a current state is a deactivation state in which battery refresh is not required any longer may be determined (S102).

Then, in the case of the deactivation state in which battery refresh is not required, battery aging factor may be decreased (S103).

On the other hand, when battery refresh continuously proceeds, the battery aging determination module 102 may determine whether battery aging proceeds based on a time period in which battery refresh proceeds, battery SOC, battery current, and so on (S104 and S105).

Accordingly, when the battery refresh proceeds for a threshold time period A or more, if battery SOC is less than a threshold value B and battery current (e.g., current with filtered noise) is less than threshold current C, battery aging may be determined to proceed, that is, the battery may be determined to be aged.

Even if battery aging is determined to proceed, a significant time period is required to restore the battery via battery refresh and, thus, a remind driving operation of re-checking whether the battery is restored may be further performed (S106).

In this case, upon determining that battery aging proceeds, the battery aging determination module 102 may stop a battery refresh operating timer (S107).

Then, the battery activation module 104 may control battery discharge for battery refresh.

As described above, the battery activation module 104 may control battery discharge in order to make an active material in the battery unstable via discharging rather than simple charging and to smooth reversible reaction of the active material in the battery.

To this end, the battery activation module 104 may control battery discharge using a refresh discharge map, for example, a 2D-type refresh discharge map that is further established based on SOC (X-axis) and battery temperature (Y-axis) (S108).

That is, battery discharge may be controlled until battery SOC is lowered to a value less than a threshold value D and a battery voltage is lowered to a value less than a threshold voltage E (S109).

As such, the reversible reaction of the active material in the battery may be smoothed in a battery aging state via discharge control of the battery activation module 104 and, thus, the battery may be restorable via sufficient charge control.

Then, the battery charging restoration module 106 may perform control for sufficient battery charging in order to restore the battery.

To this end, after the battery refresh operating timer is reset in order to restore the battery, the battery refresh operating timer may be restarted (S110) and battery charging may be controlled according to an original battery refresh map (S111).

Then, after battery charging is controlled according to the battery refresh map, whether battery refresh is further needed may be determined.

That is, as battery charging is controlled according to the battery refresh map in operation S111, whether a current state is a battery refresh deactivation state in which battery refresh is not required any longer may be determined (S112).

Accordingly, in the case of the battery refresh deactivation state, a battery refresh mode may be deactivated in order to prevent battery refresh from proceeding any longer (S113).

On the other hand, after control of battery charging is performed according to the battery refresh map in operation S111, whether battery charging is restored based on a time period in which battery refresh proceeds, battery SOC, battery current, and so on (S114).

That is, even if battery charging is controlled according to the battery refresh map in operation S111, when the battery refresh proceeds for a threshold time period A or more, if battery SOC is less than a threshold value B and battery current (e.g., current with filtered noise) is less than threshold current C, it may be determined that battery charging is not restored.

In this case, when battery charging is not restored, an aging factor may be added (S115), discharge control of the battery activation module 104 and charge control of the battery charging restoration module 106 may be repeatedly performed again and, thus, battery charge restoration may be achieved for example, battery charging efficiency may be improved.

As the battery aging factor is further adjusted, adjusting a threshold value of battery SOC (S116) needs to be further performed.

As described above, SOC charging efficiency and durability of a battery may be improved by performing control to activate an active material in the battery when battery aging is predicted and is determined to proceed.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A battery management system of a vehicle, the system comprising:
    a battery aging determination module configured to determine whether battery aging is to proceed during a refresh period in which the battery is rechargeable for a period of time that is longer than a threshold time;
    a battery activation module configured to stop battery charging by battery refresh and to control battery discharge when the battery aging determination module determines that battery aging is to proceed; and
    a battery charging restoration module configured to perform charge control according to a refresh map for battery restoration after a reversible reaction of an active material in the battery is smoothly made by discharge control of the battery activation module;
    wherein the battery aging determination module is configured to determine that the battery aging proceeds when the battery state of charge is less than a state of charge threshold value and battery current is less than threshold current even if battery charging is performed for a predetermined time according to entrance into the battery refresh.

2. The system of claim 1, wherein the battery activation module is configured to change the active material in the battery to an unstable state via discharge control to smooth reversible reaction of the active material in the battery.

3. A method of managing a battery for a vehicle, the method comprising:
    determining whether battery refresh proceeds;
    determining that battery aging proceeds based on a battery state of charge and a battery current during the battery refresh, the determination of whether the battery aging proceeds being made during a time period in which the battery refresh proceeds, wherein it is determined that battery aging proceeds when a voltage, current, and state of charge state do not satisfy threshold levels even if battery charging is performed for a predetermined time according to entrance into the battery refresh;
    controlling battery discharge based on determining that the battery aging proceeds; and
    controlling charging according to a battery refresh map in order to restore the battery.

4. The method of claim 3, further comprising, between determining whether battery refresh proceeds and determining whether battery aging proceeds, determining that a current state is a deactivation state in which the battery refresh is not required, wherein a battery aging factor is decreased.

5. The method of claim 3, wherein controlling the battery discharge comprises controlling the battery discharge according to a refresh discharge map to change an active material in the battery to an unstable state to smooth reversible reaction of the active material in the battery.

6. The method of claim 3, wherein controlling the battery discharge is performed until the battery state of charge is lowered to a value less than the state of charge threshold value and a battery voltage is lowered to a value less than a threshold voltage.

7. The method of claim 3, further comprising, after controlling the charging, deactivating a battery refresh mode based on determining that a current state is a battery refresh deactivation state in which the battery refresh is not required any longer.

8. The method of claim 3, further comprising, when the battery refresh proceeds for a threshold time period or more, if the battery state of charge is less than a state of charge threshold value and battery current is less than threshold current, determining that battery charging is not restored.

9. The method of claim 8, wherein the battery charging is not restored, the method further comprising adding an aging factor and repeatedly controlling the battery discharge and the discharging control.

10. A battery system for a vehicle, the system comprising:
a battery; and
a processor; and
a non-transitory computer-readable storage medium storing a program to be executed by the processor, the program including instructions to
determine whether a battery refresh proceeds;
determine whether battery aging proceeds based on a battery state of charge and a battery current during the battery refresh, the determination of whether the battery aging proceeds being made during a time period in which the battery refresh proceeds;
control battery discharge of the battery based on a determination that the battery aging proceeds; and
control charging of the battery according to a battery refresh map in order to restore the battery,
wherein the instruction to determine whether battery aging proceeds comprises an instruction to determine that battery aging proceeds when the battery refresh proceeds for at least a threshold time period, when the battery state of charge is less than a state of charge threshold value and battery current is less than threshold current.

11. The system of claim 10, wherein the program includes further instructions to determine whether a current state is a deactivation state in which the battery refresh is not required after determining whether battery refresh proceeds and before determining whether battery aging proceeds, wherein a battery aging factor is decreased.

12. The system of claim 10, wherein the instruction to control the battery discharge comprises an instruction to control the battery discharge according to a refresh discharge map to change an active material in the battery to an unstable state to smooth reversible reaction of the active material in the battery.

13. The system of claim 10, wherein the battery discharge is controlled until the battery state of charge is lowered to a value less than the state of charge threshold value and a battery voltage is lowered to a value less than a threshold voltage.

14. The system of claim 10, wherein the program includes further instructions to deactivate a battery refresh mode after the charge is controlled, the deactivation based on a determination that a current state is a battery refresh deactivation state in which the battery refresh is not required any longer.

15. The system of claim 10, wherein the program includes further instructions to, when the battery refresh proceeds for a threshold time period or more, if the battery state of charge is less than a state of charge threshold value and battery current is less than threshold current, determine that battery charging is not restored.

16. The system of claim 15, wherein when the battery charging is not restored, the program includes further instructions to add an aging factor and repeatedly control the battery discharge and the discharge control.

* * * * *